(12) United States Patent
Ito et al.

(10) Patent No.: US 7,847,270 B2
(45) Date of Patent: Dec. 7, 2010

(54) SEMICONDUCTOR MANUFACTURING APPARATUS AND METHOD THEREOF

(75) Inventors: Takema Ito, Yokohama (JP); Hiroyuki Morinaga, Yokohama (JP); Arata Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1259 days.

(21) Appl. No.: 11/411,822

(22) Filed: Apr. 27, 2006

(65) Prior Publication Data

US 2006/0287752 A1 Dec. 21, 2006

(30) Foreign Application Priority Data

Jun. 21, 2005 (JP) ............................. 2005-180666

(51) Int. Cl.
*G21G 5/00* (2006.01)

(52) U.S. Cl. .................... 250/492.2; 700/121; 438/795; 430/296; 430/269

(58) Field of Classification Search ............. 250/492.2; 700/121; 355/18; 438/5, 795; 430/269, 430/296

See application file for complete search history.

(56) References Cited

U.S. PATENT DOCUMENTS

| 6,232,612 B1 * | 5/2001 | Nakajima .............. 250/492.23 |
| 2005/0177268 A1 | 8/2005 | Morinaga et al. | |

FOREIGN PATENT DOCUMENTS

| JP | 03-238808 | 10/1991 |
| JP | 11-040475 | 2/1999 |

* cited by examiner

*Primary Examiner*—Robert Kim
*Assistant Examiner*—Michael Maskell
(74) *Attorney, Agent, or Firm*—Finnegan, Henderson, Farabow, Garrett & Dunner, L.L.P.

(57) ABSTRACT

According to the present invention, there is provided a semiconductor manufacturing apparatus having:

a process flow information creating section which registers an exposure device as a device for performing the pattern writing processing and an electron beam direct writing device as an alternative to the exposure device, when creating process flow information by sequentially registering processing conditions of processings in a semiconductor manufacturing process; and a control section which searches for information on the pattern writing processing based on the process flow information before the pattern writing processing, determines whether or not a mask used by the exposure device for performing the pattern writing processing searched for is installed in the exposure device, and sets the exposure device to perform the pattern writing processing in the case where it has been determined that the mask is installed in the exposure device, or sets the electron beam direct writing device to perform the pattern writing processing in the case where it has been determined that the mask is not installed in the exposure device.

18 Claims, 7 Drawing Sheets

| MASK NAME | REGISTRATION DATE AND HOUR |
|---|---|
| TXXXX20 | 200409221854 |
| TXXXX21 | 200409221900 |
| .... | .... |

FIG. 2

| PRODUCT NAME | LOT NUMBER | PROCESSING NAME | PROCESSING TYPE | STATUS | PROCESSING FINISH DATE AND HOUR |
|---|---|---|---|---|---|
| TXXXX | 0001 | M1-Litho | SUB | UNLOAD | 200409222000 |
| TAAAA | 0002 | AA-Ox | MAIN | DURING PROCESSING | |
| ... | | | | | |

FIG. 4

| PRODUCT NAME | LOT NUMBER | PROCESSING NAME | PROCESSING TYPE | PROCESSING FINISH DATE AND HOUR |
|---|---|---|---|---|
| TXXXX | 0001 | M2-Litho | SUB | 200409252100 |
| TAAAA | 0002 | GC-RIE | MAIN | 200410012200 |
| ... | | | | ... |

FIG. 5

SEMICONDUCTOR MANUFACTURING APPARATUS AND METHOD THEREOF

CROSS REFERENCE TO RELATED APPLICATIONS

This application is based upon and claims benefit of priority under 35 USC 119 from the Japanese Patent Application No. 2005-180666, filed on Jun. 21, 2005, the entire contents of which are incorporated herein by reference.

BACKGROUND OF THE INVENTION

The present invention relates to a semiconductor manufacturing apparatus and a method thereof.

In a semiconductor manufacturing process, a pattern writing processing (lithography processing) that writes a desired pattern on a resist applied to a semiconductor substrate is generally performed using an exposure device or an electron beam direct writing device.

The exposure device is superior to the electron beam direct writing device in throughput, so that, in many cases, the exposure device is used for the pattern writing processing. However, the exposure device requires a mask having a desired pattern for pattern writing processing, and therefore, cannot perform the pattern writing processing if the mask has not been carried into a clean room.

On the other hand, although the electron beam direct writing device is inferior to the exposure device in throughput, the device uses writing data (designed pattern data), rather than the mask for the pattern writing processing. Therefore, even if there is no mask, the electron beam direct writing device can perform the pattern writing if the writing data is provided.

In the case where the exposure device is used to perform a desired pattern writing processing, if the mask production takes longer than planned, the mask may not be carried into the clean room before the pattern writing processing.

In such a case, the exposure device suspends the pattern writing processing until the mask is carried into the clean room, or in other words, waits for the arrival of the mask. In this case, the exposure device cannot perform the pattern writing, and there arises a problem that the semiconductor manufacture takes longer than planned.

The following is a publication concerning a pattern exposure device:

[Patent reference 1]: Japanese Patent Laid-Open No. 11-40475

SUMMARY OF THE INVENTION

According to one aspect of the present invention, there is provided a semiconductor manufacturing method comprising:

registering an exposure device as a device for performing a pattern writing processing and an electron beam direct writing device as an alternative to the exposure device, when creating process flow information by sequentially registering processing conditions of processings in a semiconductor manufacturing process with a semiconductor production management system;

searching for information on the pattern writing processing based on the process flow information before the pattern writing processing;

determining whether or not a mask used by the exposure device for performing the pattern writing processing searched for is installed in the exposure device; and setting the exposure device to perform the pattern writing processing in the case where it has been determined that the mask is installed in the exposure device, or setting the electron beam direct writing device to perform the pattern writing processing in the case where it has been determined that the mask is not installed in the exposure device.

According to one aspect of the present invention, there is provided a semiconductor manufacturing method comprising:

registering an exposure device as a device for performing a pattern writing processing and an electron beam direct writing device as an alternative to the exposure device, when creating process flow information by sequentially registering processing conditions of processings in a semiconductor manufacturing process with a semiconductor production management system;

searching for information on the pattern writing processing based on the process flow information before the pattern writing processing;

determining whether or not a mask used by the exposure device for performing the pattern writing processing searched for is installed in the exposure device;

setting the exposure device to perform the pattern writing processing in the case where it has been determined that the mask is installed in the exposure device, or setting the electron beam direct writing device to perform the pattern writing processing in the case where it has been determined that the mask is not installed in the exposure device; and writing a desired circuit pattern on a semiconductor substrate by the exposure device performing the pattern writing processing in the case where the mask is installed in the exposure device, or writing the circuit pattern on the semiconductor substrate by the electron beam direct writing device performing the pattern writing processing in the case where the mask is not installed in the exposure device, According to one aspect of the present invention, there is provided a semiconductor manufacturing apparatus comprising:

a process flow information creating section which registers an exposure device as a device for performing the pattern writing processing and an electron beam direct writing device as an alternative to the exposure device, when creating process flow information by sequentially registering processing conditions of processings in a semiconductor manufacturing process; and a control section which searches for information on the pattern writing processing based on the process flow information before the pattern writing processing, determines whether or not a mask used by the exposure device for performing the pattern writing processing searched for is installed in the exposure device, and sets the exposure device to perform the pattern writing processing in the case where it has been determined that the mask is installed in the exposure device, or sets the electron beam direct writing device to perform the pattern writing processing in the case where it has been determined that the mask is not installed in the exposure device.

BRIEF DESCRIPTION OF THE DRAWINGS

FIG. 2 shows a data content of a mask master;

FIG. 4 shows a data content of a lot progress management database;

FIG. 5 shows a data content of a production plan management database;

DETAILED DESCRIPTION OF THE INVENTION

In the following, an embodiment of the present invention will be described with reference to the drawings.

Figure 1:
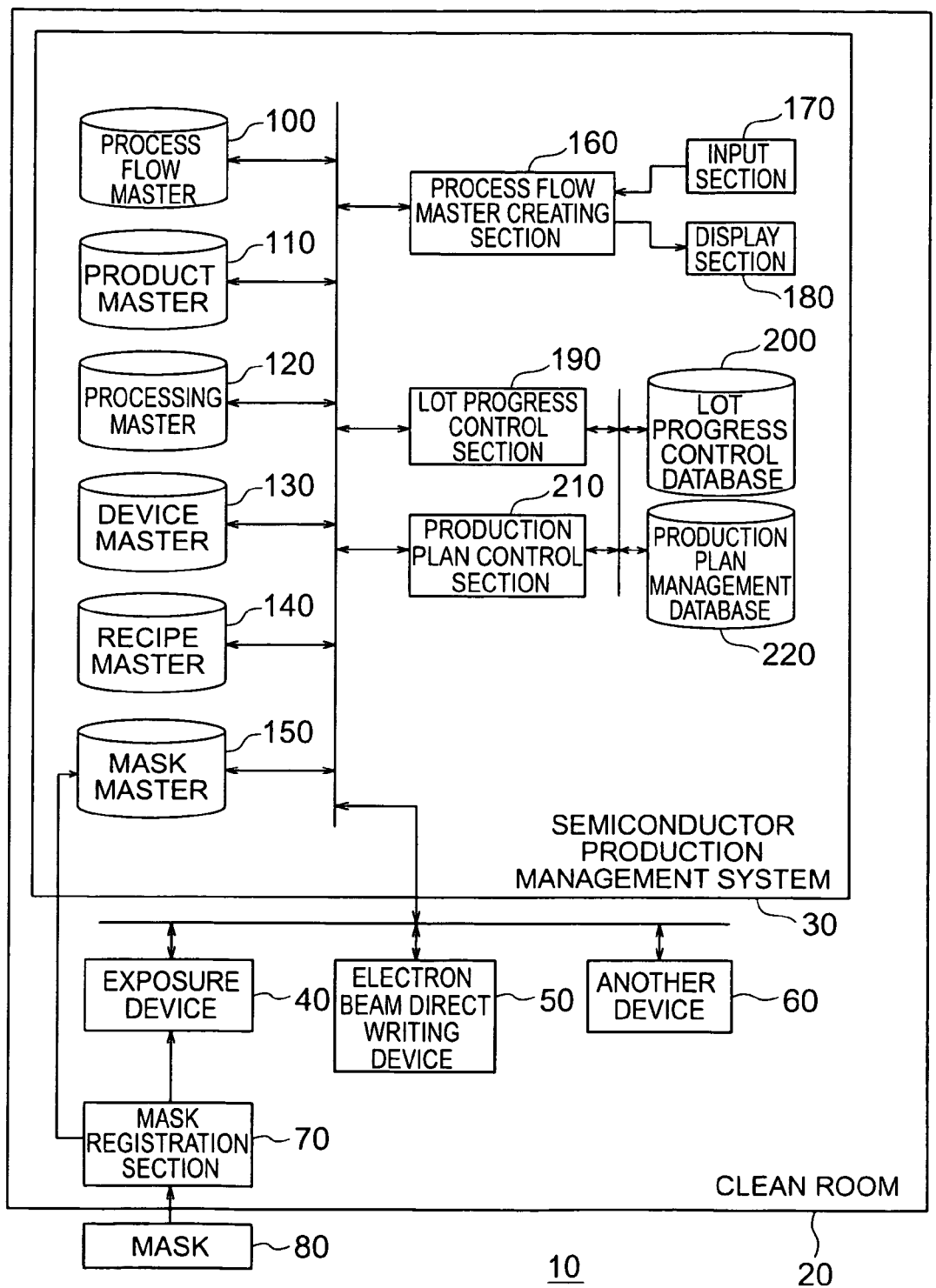
FIG. 1 is a block diagram showing an arrangement of a semiconductor manufacturing apparatus according to an embodiment of the present invention.

FIG. 1 shows an arrangement of a semiconductor manufacturing apparatus 10 according to an embodiment of the present invention. The semiconductor manufacturing apparatus 10 has a clean room 20, and a semiconductor production management system 30, an exposure device 40, an electron beam direct writing device 50 and another device 60 that performs an etching processing, for example, which are housed in the clean room 20.

The semiconductor manufacturing apparatus 10 manufactures a semiconductor product by performing about 500 processings in succession, including a loading processing, a cleaning processing, a film deposition processing, a lithography processing, an impurity diffusion processing and an unloading processing. Data that describes such processings in the execution order is referred to as a process flow, and typically, the process flow varies with each product.

For each processing, the process flow describes, as processing conditions, a processing code that represents the kind of the processing, a device name of a device used in the processing, and a recipe name that defines a parameter, such as temperature, pressure and kind of gas. If the processing is a pattern writing processing, the process flow further describes a mask name of a mask used in the processing.

As databases, the semiconductor production management system 30 has a process flow master 100 that stores a process flow for each product, a product master 110 that stores a product name, such as logic and memory, a processing master 120 that stores a processing code and a processing name associated with each other, a device master 130 that stores a device name of a device used in each processing, a recipe master 140 that stores a recipe name of a recipe used by each device, and a mask master 150 that stores a mask name of a mask used in a pattern writing processing.

The mask master 150 initially stores only the mask name of a mask to be used. In this state, if a manufactured mask 80 is externally carried into the clean room 20, a mask registration section 70 registers the carried mask 80 and passes the mask 80 to the predetermined exposure device 40. In this case, as shown in FIG. 2, as the registration date and hour, the mask registration section 70 stores the date and hour of carriage of the mask 80 into the clean room associated with the mask name of the carried mask 80 selected from among the mask names stored in the mask master 150.

A process flow master creating section 160 reads required data from the masters 100 to 150 in response to an operator's manipulation of an input section 170 and makes a display section 180 display a process flow master registration screen based on the read data.

The operator manipulates the input section 170 while viewing the process flow master registration screen displayed on the display section 180, and, in response to the manipulation, the process flow master creating section 160 creates a process flow for each product and stores these process flows in the process flow master 100.

More specifically, for a processing to be registered, a desired product name is selected from the product master 110 and registered, and then, a processing code that represents a desired processing name is selected from the processing master 120 and registered. Similarly, a desired device name and a desired recipe name are selected from the device master 130 and the recipe master 140, respectively, and registered, and if the relevant processing is the pattern writing processing, a desired mask name is selected from the mask master 150 and registered.

For each of the following processings, similarly, a product name, a processing code, a device name and a recipe name, as well as a mask name in the case where the processing is the pattern writing processing, are sequentially selected and registered, thereby creating a process flow. In addition, process flows are sequentially created for various different products, and the created process flows are stored in the process flow master 100.

According to this embodiment, the pattern writing processing is performed by the exposure device 40 in principle. If the mask 80 has not been carried into the clean room 20 before the exposure device 40 performs the pattern writing processing, the device for performing the pattern writing processing can be switched to the electron beam direct writing device 50, and the electron beam direct writing device 50 can be used for the pattern writing processing. In this specification, the pattern writing processing by the exposure device 40 is referred to as a main processing, and the pattern writing processing by the electron beam direct writing device 50 is referred to as a sub processing.

Figure 3:
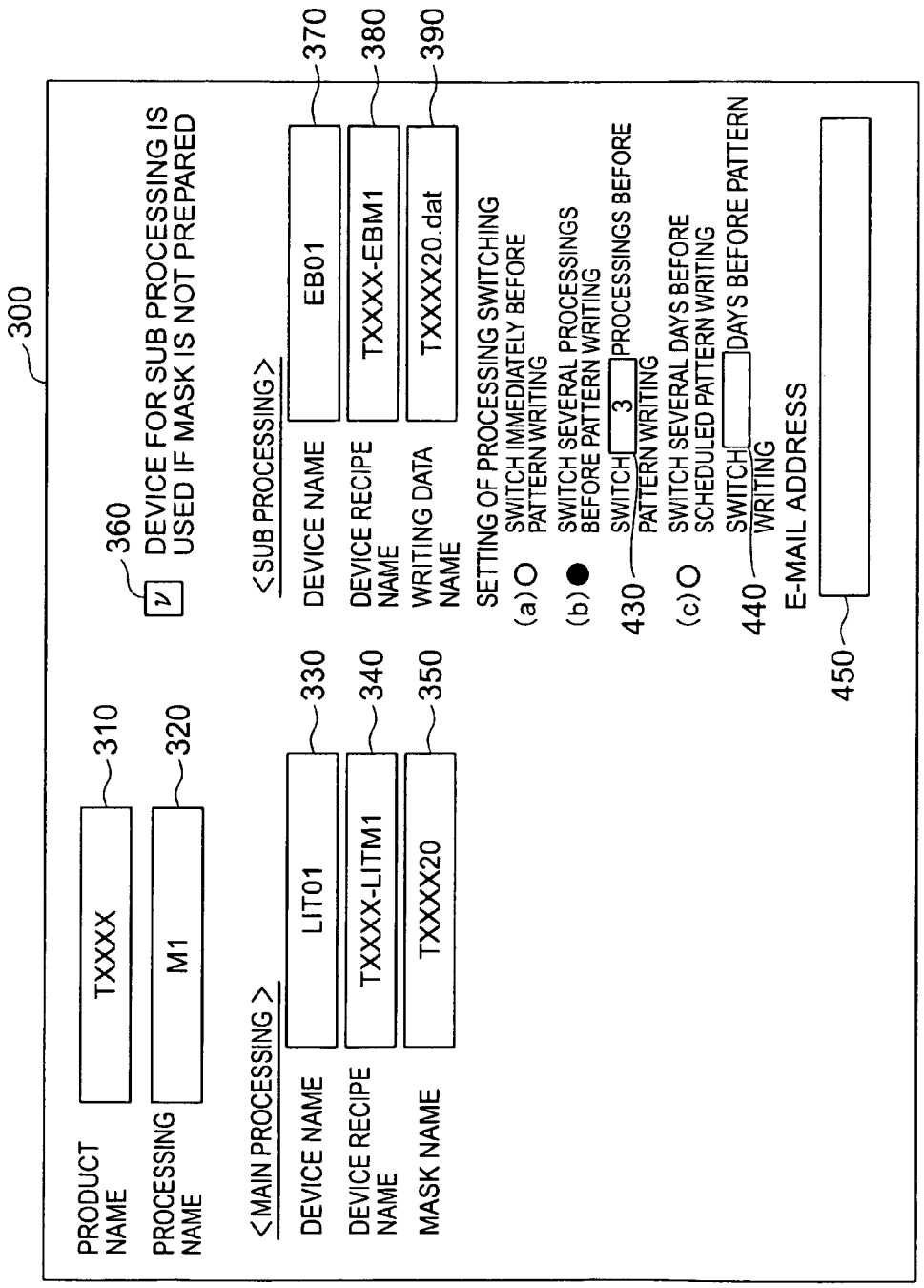
FIG. 3 shows a process flow master registration screen.

FIG. 3 shows an example of a process flow master registration screen 300. The process flow master registration screen 300 is displayed on the display section 180 based on the data read from the process flow master 100. The operator creates the process flow master 100 by manipulating the input section 170 while viewing the process flow master registration screen 300.

For example, for the pattern writing processing to be registered that is currently displayed, if a product name entry space 310 is selected, a list of product names stored in the product master 110 is displayed. Then, a desired product name is selected from among the displayed product names and registered. Then, if a processing name entry space 320 is selected, a list of processing codes and corresponding processing names stored in the processing master 120 is displayed. Then, a desired processing name is selected from among the displayed processing names and registered.

Similarly, the device name of a device, a recipe name and a mask name which are used in the case of the main processing (the pattern writing processing by the exposure device 40) are sequentially entered to a device name entry space 330, a recipe name entry space 340 and a mask name entry space 350, respectively, and registered.

The process flow master registration screen 300 displays a check box 360 that allows selection of whether or not the device for performing the pattern writing processing is switched to the electron beam direct writing device 50 for the sub processing, if the mask 80 has not been carried into the clean room 20 before the pattern writing processing is performed.

According to this embodiment, the check box 360 is checked, in the case where the mask 80 has not been carried into the clean room 20 before the pattern writing processing is performed, thereby switching the device for performing the pattern writing processing to the electron beam direct writing device 50.

In this case, as in the case of the main processing, the device name of a device, a recipe name and a writing data name used for the sub processing are sequentially entered to a device name entry space 370, a recipe name entry space 380 and a writing data name entry space 390, respectively, and registered. The writing data is previously stored in an internal memory of the electron beam direct writing device 50.

Furthermore, according to this embodiment, the timing of switching of the device for performing the pattern writing processing from the exposure device 40 for the main processing to the electron beam direct writing device 50 for the sub processing can be selected.

Specifically, the timing of switching the device for performing the pattern writing processing may be: (a) immediately before the pattern writing processing (in other words, after the semiconductor substrate is unloaded from the device for performing the processing preceding the pattern writing processing and before the device for performing the pattern writing processing receives the semiconductor substrate); (b) several processings before the pattern writing processing; or (c) several days before the pattern writing processing. The operator can select a desired one from among the timings (a) to (c).

In the case where the switching timing (b) is selected, the number of processings is entered in a number-of-processings entry space 430 to set the number of processings between the switching and the pattern writing processing. In the case where the switching timing (c) is selected, the number of days is entered in a number-of-days entry space 440 to set the number of days between the switching and the pattern writing processing.

If an e-mail address is entered to an e-mail address entry space 450 and registered, when the device for performing the pattern writing processing is switched, an e-mail can be transmitted to the e-mail address to inform the operator of the switching of the device for performing the pattern writing processing.

In a semiconductor manufacturing process, semiconductor substrates are carried in units of lot, which contains a plurality of semiconductor substrates, and each processing is performed on a lot basis. A lot progress control section 190 controls the progress of each lot and stores data about the progress of each lot in a lot progress management database 200. Specifically, the lot progress management database 200 retains historical information about the processings having already been performed on each lot and the processing currently being performed on each lot.

FIG. 4 shows an example of the lot progress management database 200. The lot progress management database 200 manages the progress of each lot in such a manner that the product name, the lot number, the processing name, the processing type in the case where the processing is the pattern writing processing, the status and the processing finish date and hour are associated with each other.

A production plan control section 210 makes a production plan for each lot, creates data about the production plan for each lot and stores the data in a production plan management database 220. Specifically, the production plan management database 220 retains production plan information about the future production plan for each lot, including the scheduled processing date and hour of a processing yet to be performed.

FIG. 5 shows an example of the production plan management database 220. The production plan management database 220 manages the production plan for each lot in such a manner that the product name, the lot number, the processing name, the processing type in the case where the processing is the pattern writing processing, and the processing finish date and hour are associated with each other.

In other words, the production plan control section 210 creates the production plan management database 220 based on the masters 100 to 150 and the lot progress management database 200. Based on the process flow master 100 and the production plan management database 220, the lot progress control section 190 issues a control instruction to a desired device of the devices 40 to 60, thereby making the device perform a desired processing.

Once the lot progress control section 190 is informed by the device to which the control instruction is issued that the processing has been performed, the lot progress control section 190 updates the lot progress control database 200 and issues a control instruction to perform the next processing to a desired device based on the production plan management database 220.

In doing this, the lot progress control section 190 informs the production plan control section 210 of the progress of each lot, thereby making the production plan control section 210 update the production plan management database 220 as required.

The exposure device 40 is a device that uses the mask 80 to perform the pattern writing processing (that is, exposure), and the electron beam direct writing device 50 is a device that uses the writing data to perform the pattern writing processing (that is, irradiation with an electron beam). The device 60 is a device for performing resist application, development, etching and the like.

Therefore, in performing the pattern writing processing, the device 60 first applies a resist onto a semiconductor substrate. Then, the semiconductor substrate is carried from the device 60 to the exposure device 40 or the electron beam direct writing device 50. Then, the exposure device 40 or the electron beam direct writing device 50 writes a gate pattern, for example, on the resist by performing the pattern writing processing. Then, the semiconductor substrate is carried from the exposure device 40 or the electron beam direct writing device 50 to the device 60, and the device 60 performs development, etching and resist removal in succession, thereby forming the gate pattern.

Figure 6:
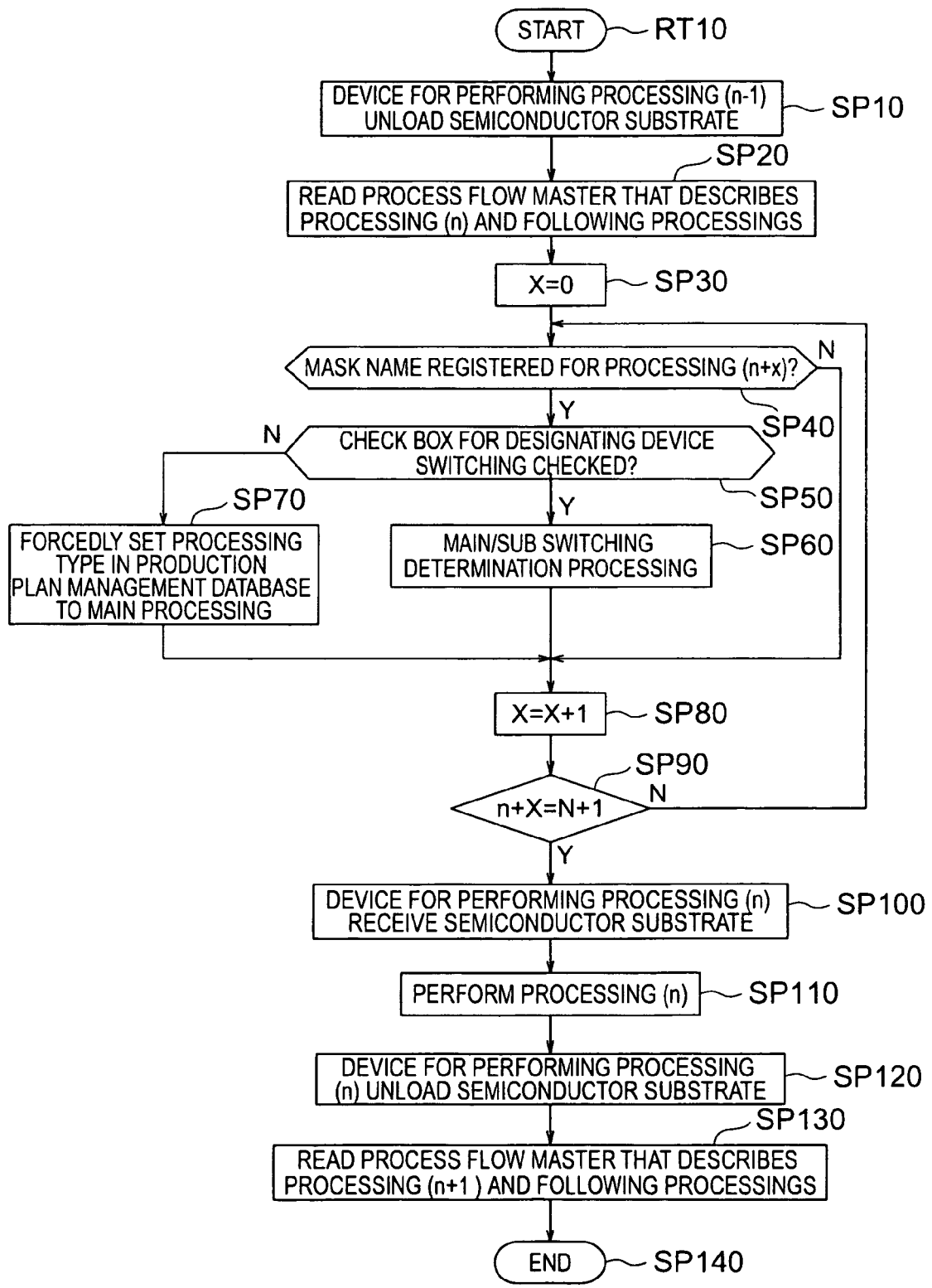
FIG. 6 is a flowchart showing a progress control procedure.

FIG. 6 shows a progress control procedure RT10 according to this embodiment. In the following, processings after the semiconductor substrate is unloaded from the device for performing a (n−1)-th processing (n−1) will be described. Referring to FIG. 6, once the progress control procedure RT10 is entered, relevant processings are performed in succession, and in step SP10 the semiconductor substrate is unloaded from the device for performing the (n−1)-th processing (n−1), in step SP20, the lot progress control section 190 reads a process flow master that describes an n-th processing (n) and the following processings from the process flow master 100.

In step SP30, the lot progress control section 190 sets the variable "x", which is to be added to the processing number "n", at "0". In this case, a (n+x)-th processing (n+x) will be performed "x" processings after the present time.

In step SP40, based on the read process flow master, the lot progress control section 190 determines whether or not there is a mask name registered for the n-th processing (n). If the result of the determination in step SP40 is YES, it means that the n-th processing (n) is the pattern writing processing, and then, the lot progress control section 190 proceeds to step SP50.

In step SP50, the lot progress control section 190 determines, for the n-th processing (n), whether or not the check box 360 has been checked to switch the device for performing the pattern writing processing to the electron beam direct writing device 50, if the mask 80 has not been carried into the clean room 20.

If the result of the determination in step SP50 is YES, the lot progress control section 190 proceeds to step SP60 and performs a main/sub switching determination processing. If the switching timing conditions is satisfied, the device for performing the n-th processing (n), which is the pattern writing processing, is switched to the electron beam direct writing device 50 for the sub processing, for example.

If it is determined that the check box 360 has not been checked in step SP50, the lot progress control section 190 proceeds to step SP70 and forcedly sets the processing type of the n-th processing (n) in the production plan management database 220 at the "main processing". In this case, if the mask 80 has not been carried into the clean room 20 when starting the pattern writing processing, the exposure device 40 suspends the pattern writing processing until the mask 80 is carried into the clean room 20.

If the result of the determination in step SP40 is NO, it means that the n-th processing (n) is not the pattern writing processing. In this case, the lot progress control section 190 proceeds to step SP80 without making any setting of the device for performing the pattern writing processing.

In step SP80, the lot progress control section 190 increments the variable "x" by 1, and in the following step SP90, it is determined whether or not the processing number (n+x) is equal to "N+1", which is the processing number "N" of the last processing incremented by 1. If the result of the determination in step SP90 is NO, the lot progress control section 190 returns to step SP40 and repeats the steps SP40 to SP80 described above.

After that, similarly, such operations are repeated in succession, thereby searching for a processing that is the pattern writing processing and requires device switching in the processings including the n-th processing (n) to the last processing (N). If the processing searched for satisfies the switching timing condition, the device used in the processing is switched.

Then, when the processing number (n+x) becomes equal to "N+1", the result of the determination in step SP90 is YES. Then, the lot progress control section 190 proceeds to step SP100 and issues a control instruction to the device for performing the n-th processing (n) to make the device receive the semiconductor substrate.

In step SP110, the device having received the control instruction performs the n-th processing (n). Then, when the semiconductor substrate is unloaded from the device in step SP120, the lot progress control section 190 is informed of the unloading and then updates the log progress management database 200.

In step SP130, the lot progress control section 190 reads a process flow master that describes a (n+1)-th processing (n+1) and the following processings from the process flow master 100. After that, similarly, each time a processing is to be performed, the lot progress control section 190 searches for the pattern writing processing that requires device switching and performs device switching if the switching timing condition is satisfied by repeating the operations described above. Then, once the last processing (N), which is the unloading processing, is performed, the lot progress control section 190 proceeds to step SP140 and finishes the progress control procedure RT10.

In a semiconductor manufacturing process, in general, the process flow master 100 may be modified due to a modification of the processing condition of a processing yet to be performed during each processing. Thus, according to this embodiment, each time a processing is to be performed, the pattern writing processing that requires device switching is searched for, as described above.

Figure 7:
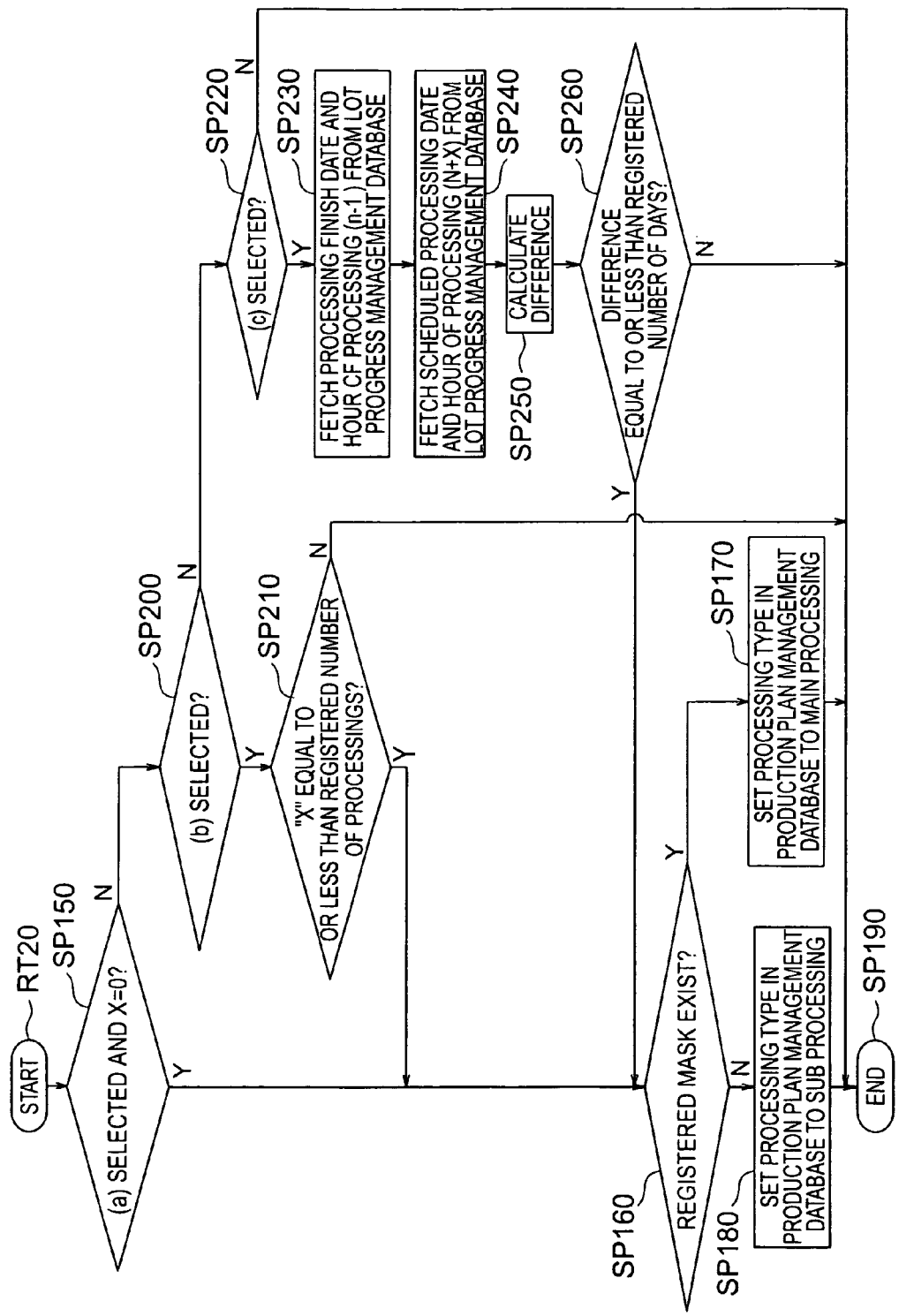
FIG. 7 is a flowchart showing a main/sub switching determination procedure.

FIG. 7 shows a main/sub switching determination procedure RT20 performed in step SP60 in the progress control procedure RT10. Referring to FIG. 7, once the main/sub switching determination procedure RT20 is entered, in step SP150, the lot progress control section 190 determines whether or not the timing (a) (immediately before the pattern writing processing) is selected as the timing of switching of the device for performing the pattern writing processing, and the variable "x" is "0".

If the result of the determination in step SP150 is YES, it means that the timing of switching of the device for performing the pattern writing processing is immediately before the pattern writing processing, and the next n-th processing (n) is the pattern writing processing. Then, the lot progress control section 190 proceeds to step SP160.

In step SP160, by referring to the registration date and hour in the mask master 150, the lot progress control section 190 determines whether or not the mask registered with the process flow master 100 has been carried into the clean room 20. If the result of the determination in step SP160 is YES, the lot progress control section 190 proceeds to step SP170 to set the processing type in the production plan management database 220 at the "main processing", and then, proceeds to step SP190 to finish the main/sub switching determination procedure RT20. If the result of the determination in step SP160 is NO, the lot progress control section 190 sets the processing type in the production plan management database 220 at the "sub processing".

If the result of the determination in step SP150 is NO, it means that the switching timing (a) is not selected, and/or the variable "x" is not "0". In this case, the lot progress control section 190 proceeds to step SP200 and determines whether or not the switching timing (b) (several processings before the pattern writing processing) is selected.

If the result of the determination in step SP200 is YES, the lot progress control section 190 proceeds to step SP210 and determines whether or not the variable "x" is equal to or less than the number of processings registered with the process flow master 100.

If the result of the determination in step SP210 is YES, it means that the number of processings between the present time and the pattern writing processing that requires device switching is equal to or less than the number of processings registered with the process flow master 100. In this case, the lot progress control section 190 proceeds to step SP160 and determines whether or not the registered mask has been carried into the clean room 20 as described above.

If the result of the determination in step SP160 is YES, the lot progress control section 190 proceeds to step 170 and sets the processing type in the production plan management database 220 at the "main processing". If the result of the determination in step SP160 is NO, the lot progress control section 190 proceeds to step SP180 and sets the processing type in the production plan management database 220 at the "sub processing".

According to this embodiment, not only in the case where the variable "x" is equal to the number of processings registered with the process flow master 100, but also in the case where the variable "x" is less than the number of the processings, the lot progress control section 190 determines whether or not the mask 80 has been carried into the clean room 20 (step SP210).

Therefore, if the mask 80 is carried into the clean room 20 after the processing type in the production plan management database 220 is switched from the "main processing" to the "sub processing" and before the pattern writing processing that requires device switching is performed, the lot progress control section 190 returns the processing type in the production plan management database 220 to the initial "main processing", thereby making the exposure device 40 perform the pattern writing processing.

If the result of the determination in step SP210 is NO, it means that the number of processings between the present time and the pattern writing processing that requires device switching is more than the number of processings registered with the process flow master 100. In this case, the lot progress control section 190 proceeds to step SP190 and finishes the main/sub switching determination procedure RT20.

If the result of the determination in step SP200 is NO, it means that the switching timing (a) is not selected, and/or the variable is not "0", as well as that the switching timing (b) is not selected. In this case, the lot progress control section 190 proceeds to step SP220 and determines whether or not the switching timing (c) (several days before the pattern writing processing) is selected.

If the result of the determination in step SP220 is YES, the lot progress control section 190 proceeds to step SP230 and acquires the processing finish date and hour of the (n−1)-th processing (n−1) from the lot progress management database 200. Then, the lot progress control section 190 proceeds to step SP240 and acquires the scheduled processing date and hour of the (n+x)-th processing (n+x) from the production plan management database 220.

In step SP250, the lot progress control section 190 subtracts the processing finish date and hour of the (n−1)-th processing (n−1) from the scheduled processing date and hour of the (n+x)-th processing (n+x), thereby calculating the number of days therebetween. Then, the lot progress control section 190 proceeds to step SP260, and it is determined whether or not the calculated number of days is equal to or less than the number of days registered with the process flow master 100.

If the result of the determination in step SP260 is YES, it means that the number of days between the present time and the pattern writing processing that requires device switching is equal to or less than the number of days registered with the process flow master 100. In this case, the lot progress control section 190 proceeds to step SP160 and determines whether or not the registered mask has been carried into the clean room 20 as described above.

If the result of the determination in step SP160 is YES, the lot progress control section 190 proceeds to step SP170 and sets the processing type in the production plan management database 220 at the "main processing". If the result of the determination in step SP160 is NO, the lot progress control section 190 proceeds to step SP180 and sets the processing type in the production plan management database 220 at the "sub processing".

In this case, in step SP260, as in step SP210, not only in the case where the calculated number of days between the processing finish date and hour and the scheduled processing date and hour is equal to the number of days registered with the process flow master 100, but also in the case where the calculated number of days is less than the number of days registered with the process flow master 100, the lot progress control section 190 determines whether or not the mask 80 has been carried into the clean room 20.

If the result of the determination in step SP260 is NO, it means that the number of days between the present time and the pattern writing processing that requires device switching is more than the number of days registered with the process flow master 100. In this case, the lot progress control section 190 proceeds to step SP190 and finishes the main/sub switching determination procedure RT20.

If the result of the determination in step SP220 is NO, it means that the switching timing (a) is not selected, and/or the variable is not "0", as well as that neither the switching timing (b) nor (c) is selected. In this case, the lot progress control section 190 proceeds to step SP190 and finishes the main/sub switching determination procedure RT20.

As described above, according to this embodiment, failure of the pattern writing processing can be prevented even if the mask 80 has not been carried into the clean room 20 when the exposure device 40 is to start the pattern writing processing. Therefore, the throughput of a semiconductor manufacturing process can be prevented being reduced.

The embodiment described above is only an example and should not be construed as limiting the present invention. For example, a circuit pattern other than the gate pattern, such as a wiring pattern, may be written on the resist using the exposure device 40 or electron beam direct writing device 50.

What is claimed is:

1. A semiconductor manufacturing method, comprising:
    registering an exposure device as a device for performing a pattern writing processing and an electron beam direct writing device as an alternative to the exposure device, when creating process flow information by sequentially registering processing conditions of processings in a semiconductor manufacturing process with a semiconductor production management system;
    searching for information on the pattern writing processing based on the process flow information before the pattern writing processing;
    determining whether or not a mask used by the exposure device for performing the pattern writing processing searched for is installed in the exposure device; and
    setting the exposure device to perform the pattern writing processing in the case where it has been determined that the mask is installed in the exposure device, or setting the electron beam direct writing device to perform the pattern writing processing in the case where it has been determined that the mask is not installed in the exposure device.

2. The semiconductor manufacturing method according to claim 1, wherein, when creating the process flow information, as the timing of setting of the device for performing the pattern writing processing, a timing of before the pattern writing processing or a timing of a desired number of processings before the pattern writing processing is registered, and
    when setting the device for performing the pattern writing device, it is determined at the registered timing whether or not the mask is installed in the exposure device, and according to the result of the determination, the exposure device or the electron beam direct writing device is set to perform the pattern writing processing.

3. The semiconductor manufacturing method according to claim 2, wherein, when creating the process flow information, as the timing of setting of the device for performing the pattern writing processing, any of a timing of before the pattern writing processing, a timing of a desired number of processings before the pattern writing processing and a timing of a desired number of days before the pattern writing processing is selected and registered, and
    when setting the device for performing the pattern writing device, in the case where the timing of a desired number of days before the pattern writing processing is registered as the timing of setting of the device for performing the pattern writing processing, the timing of setting of the device for performing the pattern writing processing is determined based on the processing date and hour of each of the processings.

4. The semiconductor manufacturing method according to claim 1, wherein, when setting the device for performing the pattern writing processing, in the case where the mask is installed in the exposure device after the electron beam direct writing device is set to perform the pattern writing processing the exposure device is set again to perform the pattern writing processing.

5. The semiconductor manufacturing method according to claim 1, wherein, when setting the device for performing the pattern writing processing, at a timing when the device for performing the pattern writing processing is switched from the exposure device to the electron beam direct writing device or switched from the electron beam direct writing device to the exposure device, information indicating the switching of the device for performing the pattern writing device is transmitted to a predetermined destination.

6. The semiconductor manufacturing method according to claim 1, wherein, when setting the device for performing the pattern writing processing, in the case where only the exposure device is registered as the device for performing the pattern writing processing, the exposure device is set to perform the pattern writing processing regardless of whether or not the mask is installed in the exposure device.

7. A semiconductor manufacturing method, comprising:
registering an exposure device as a device for performing a pattern writing processing and an electron beam direct writing device as an alternative to the exposure device, when creating process flow information by sequentially registering processing conditions of processings in a semiconductor manufacturing process with a semiconductor production management system;
searching for information on the pattern writing processing based on the process flow information before the pattern writing processing;
determining whether or not a mask used by the exposure device for performing the pattern writing processing searched for is installed in the exposure device;
setting the exposure device to perform the pattern writing processing in the case where it has been determined that the mask is installed in the exposure device, or setting the electron beam direct writing device to perform the pattern writing processing in the case where it has been determined that the mask is not installed in the exposure device; and
writing a desired circuit pattern on a semiconductor substrate by the exposure device performing the pattern writing processing in the case where the mask is installed in the exposure device, or writing the circuit pattern on the semiconductor substrate by the electron beam direct writing device performing the pattern writing processing in the case where the mask is not installed in the exposure device.

8. The semiconductor manufacturing method according to claim 7, wherein, when creating the process flow information, as the timing of setting of the device for performing the pattern writing processing, a timing of before the pattern writing processing or a timing of a desired number of processings before the pattern writing processing is registered, and
when setting the device for performing the pattern writing device, it is determined at the registered timing whether or not the mask is installed in the exposure device, and according to the result of the determination, the exposure device or the electron beam direct writing device is set to perform the pattern writing processing.

9. The semiconductor manufacturing method according to claim 8, wherein, when creating the process flow information, as the timing of setting of the device for performing the pattern writing processing, any of a timing of before the pattern writing processing, a timing of a desired number of processings before the pattern writing processing and a timing of a desired number of days before the pattern writing processing is selected and registered, and
when setting the device for performing the pattern writing device, in the case where the timing of a desired number of days before the pattern writing processing is registered as the timing of setting of the device for performing the pattern writing processing, the timing of setting of the device for performing the pattern writing processing is determined based on the processing date and hour of each of the processings.

10. The semiconductor manufacturing method according to claim 7, wherein, when setting of the device for performing the pattern writing processing, in the case where the mask is installed in the exposure device after the electron beam direct writing device is set to perform the pattern writing processing the exposure device is set again to perform the pattern writing processing.

11. The semiconductor manufacturing method according to claim 7, wherein, when setting the device for performing the pattern writing processing, at a timing when the device for performing the pattern writing processing is switched from the exposure device to the electron beam direct writing device or switched from the electron beam direct writing device to the exposure device, information indicating the switching of the device for performing the pattern writing device is transmitted to a predetermined destination.

12. The semiconductor manufacturing method according to claim 7, wherein, when setting the device for performing the pattern writing processing, in the case where only the exposure device is registered as the device for performing the pattern writing processing, the exposure device is set to perform the pattern writing processing regardless of whether or not the mask is installed in the exposure device.

13. A semiconductor manufacturing apparatus, comprising:
a process flow information creating section which registers an exposure device as a device for performing the pattern writing processing and an electron beam direct writing device as an alternative to the exposure device, when creating process flow information by sequentially registering processing conditions of processings in a semiconductor manufacturing process; and
a control section which searches for information on the pattern writing processing based on the process flow information before the pattern writing processing, determines whether or not a mask used by the exposure device for performing the pattern writing processing searched for is installed in the exposure device, and sets the exposure device to perform the pattern writing processing in the case where it has been determined that the mask is installed in the exposure device, or sets the electron beam direct writing device to perform the pattern writing processing in the case where it has been determined that the mask is not installed in the exposure device.

14. The semiconductor manufacturing apparatus according to claim 13, wherein, as the timing of setting of the device for performing the pattern writing processing, the process flow information creating section registers a timing of before the pattern writing processing or a timing of a desired number of processings before the pattern writing processing, and the control section determines at the registered timing whether or not the mask is installed in the exposure device and, according to the result of the determination, sets the exposure device or the electron beam direct writing device to perform the pattern writing processing.

15. The semiconductor manufacturing apparatus according to claim 14, wherein, as the timing of setting of the device for performing the pattern writing processing, the process flow information creating section selects and registers any of a timing of before the pattern writing processing, a timing of a desired number of processings before the pattern writing processing and a timing of a desired number of days before the pattern writing processing, and in the case where the timing of a desired number of days before the pattern writing processing is registered as the timing of setting of the device for performing the pattern writing processing, the control section determines the timing of setting of the device for performing the pattern writing processing based on the processing date and hour of each of the processings.

16. The semiconductor manufacturing apparatus according to claim 13, wherein, in the case where the mask is installed in the exposure device after the electron beam direct writing device is set to perform the pattern writing processing, the control section sets the exposure device again to perform the pattern writing processing.

17. The semiconductor manufacturing apparatus according to claim 13, wherein, at a timing when the device for performing the pattern writing processing is switched from the exposure device to the electron beam direct writing device or switched from the electron beam direct writing device to the exposure device, the control section transmits information indicating the switching of the device for performing the pattern writing device to a predetermined destination.

18. The semiconductor manufacturing apparatus according to claim 13, wherein, in the case where only the exposure device is registered as the device for performing the pattern writing processing, the control section sets the exposure device to perform the pattern writing processing regardless of whether or not the mask is installed in the exposure device.

* * * * *